(12) United States Patent
Chen et al.

(10) Patent No.: US 12,230,581 B2
(45) Date of Patent: Feb. 18, 2025

(54) MULTI-DEVICE GRADED EMBEDDING PACKAGE SUBSTRATE AND MANUFACTURING METHOD THEREOF

(71) Applicant: Zhuhai ACCESS Semiconductor Co., Ltd, Guangdong (CN)

(72) Inventors: Xianming Chen, Guangdong (CN); Lei Feng, Guangdong (CN); Benxia Huang, Guangdong (CN); Yejie Hong, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 433 days.

(21) Appl. No.: 17/741,649

(22) Filed: May 11, 2022

(65) Prior Publication Data
US 2022/0367373 A1 Nov. 17, 2022

(30) Foreign Application Priority Data
May 14, 2021 (CN) .......................... 202110533782.5

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 21/4853; H01L 21/4857; H01L 21/6835; H01L 23/5389; H01L 23/3121; H01L 23/3128; H01L 23/49822; H01L 23/3677; H01L 23/5383; H01L 23/5386; H01L 24/19; H01L 24/20; H01L 24/96; H01L 2221/6835; H01L 2224/04105; H01L 2224/214; H01L 2224/215;
(Continued)

(56) References Cited

U.S. PATENT DOCUMENTS

| 2010/0059876 A1* | 3/2010 | Shimizu | H01L 24/83 |
| | | | 257/E21.511 |
| 2017/0287825 A1* | 10/2017 | Lee | H01L 24/20 |
| 2020/0013721 A1* | 1/2020 | Chiang | H01L 21/6835 |

FOREIGN PATENT DOCUMENTS

CN 109686669 A 4/2019

* cited by examiner

*Primary Examiner* — Eric A. Ward
(74) *Attorney, Agent, or Firm* — The PL Law Group, PLLC

(57) ABSTRACT

A multi-device graded embedding package substrate includes a first dielectric layer, a second dielectric layer, and a third dielectric layer. The first dielectric layer includes a first conductive copper pillar layer and a first device cavity. The second dielectric layer includes a first wiring layer located in a lower surface of the second dielectric layer, a second conductive copper pillar layer and a heat dissipation copper block layer provided on the first wiring layer. The third dielectric layer includes a second wiring layer, a third conductive copper pillar layer provided on the second wiring layer. A first device is attached to the bottom of the first device cavity, and a terminal of the first device is in conductive connection with the second wiring layer. A second device is attached to the bottom of a second device cavity penetrating through the first, second and third dielectric layers.

12 Claims, 6 Drawing Sheets

(51) Int. Cl.
*H01L 21/683* (2006.01)
*H01L 23/00* (2006.01)

(52) U.S. Cl.
CPC ...... *H01L 21/6835* (2013.01); *H01L 23/5383* (2013.01); *H01L 23/5386* (2013.01); *H01L 24/19* (2013.01); *H01L 24/20* (2013.01); *H01L 2221/6835* (2013.01); *H01L 2224/214* (2013.01); *H01L 2224/215* (2013.01); *H01L 2924/01029* (2013.01)

(58) Field of Classification Search
CPC ......... H01L 2224/2518; H01L 2224/96; H01L 2924/01029; H05K 1/185; H05K 3/4661
See application file for complete search history.

MULTI-DEVICE GRADED EMBEDDING PACKAGE SUBSTRATE AND MANUFACTURING METHOD THEREOF

CROSS-REFERENCE TO RELATED APPLICATION

This application claims the benefit under 35 USC § 119 of Chinese Patent Application No. 202110533782.5, filed on May 14, 2021, in the China Intellectual Property Office, the entire disclosure of which is incorporated herein by reference for all purposes.

BACKGROUND

1. Technical Field

The present invention relates to an electronic device package structure, and more particularly to a multi-device graded embedding package substrate and a manufacturing method thereof.

2. Description of the Related Art

With the development of electronic technology, the demand for electronic products tends to be highly functional and miniaturized. Since the miniaturization of chips is close to a limit, how to reasonably package multiple chips and other components and parts to achieve high functionalization and miniaturization has become an important research topic in the current industrial research. At the same time, due to the consideration of costs and efficiency, panel-level packaging has also become a current trend. In the process of manufacturing the substrate, embedding chips and other components into the substrate can effectively reduce the packaging volume and improve the output efficiency. At the same time, compared with wafer-level packaging, the cost is greatly reduced. With the continuous development and evolution, panel-level embedded packaging technology has been more and more frequently applied, playing an increasingly important role in the field of semiconductor packaging. At the same time, panel-level embedded packaging technology has also been developed. Currently, in the field of panel-level embedded packaging, the embedded packaging of multiple chips and other components can be realized, but there are still some limitations.

The existing panel-level embedded packaging scheme can realize the embedded packaging of multiple chips. For example, the prior art document CN109686669A discloses an integrated circuit packaging method and a package structure. As shown in FIG. 1, the package structure embeds multiple chips 11 at one time in a frame 10 at the middle layer of a substrate, and performs single-side fan-out after packaging, and then performs double-side layer-adding. The scheme has certain limitations. All chips must be embedded and packaged in a starting layer at one time. If multiple chips are embedded and packaged in different layers, this scheme cannot be realized. In addition, this scheme cannot be used if the difference in thickness between components such as chips is too large and there is I/O that requires double-side fan-out. In the field of panel-level embedded packaging, currently, there is no good solution for the requirement that multiple components are embedded and packaged in multiple layers at different times.

With regard to the embedding of multiple components such as chips, the traditional board-level embedding package substrate is most commonly performed by horizontally spreading all the components for one-time embedding, making it difficult to embed and package the components such as chips into the most reasonable substrate layer through a free design. Most of the traditional board-level embedded packaging methods embed multiple chips and other components in the same layer at one time, which requires that the thickness difference between components should not be too large. Otherwise, the embedded packaging quality is affected, especially for components and parts with I/O on both sides that needs fan-out. If the thickness difference is too large, it is difficult to achieve I/O fan-out for components with small thickness.

SUMMARY

The implementation schemes of the present invention involve providing a multi-device graded embedding package substrate and a manufacturing method thereof to solve the above technical problems. In the present invention, by embedding and packaging components with different thicknesses in different times, the components are respectively embedded in the most reasonable substrate layer through a free design, thereby realizing the embedding and packaging of multiple components with a large thickness difference and facilitating double-side fan-out of each component.

The first aspect of the present invention involves a multi-device graded embedding package substrate, comprising a first dielectric layer, a second dielectric layer above the first dielectric layer, and a third dielectric layer below the first dielectric layer, wherein the first dielectric layer comprises a first conductive copper pillar layer penetrating through the first dielectric layer along a height direction and a first device cavity, the second dielectric layer comprises a first wiring layer located in a lower surface of the second dielectric layer, a second conductive copper pillar layer and a heat dissipation copper block layer are provided on the first wiring layer, the third dielectric layer comprises a second wiring layer located in an upper surface of the third dielectric layer, a third conductive copper pillar layer is provided on the second wiring layer, and the first wiring layer and the second wiring layer are conductively connected via the first conductive copper pillar layer, wherein a first device is attached to a bottom of the first device cavity so that a terminal of the first device is conductively connected to the second wiring layer, and the first device is connected to the heat dissipation copper block layer via the first wiring layer; a second device cavity penetrating through the first dielectric layer, the second dielectric layer, and the third dielectric layer is further comprised, wherein a second device is attached to the bottom of the second device cavity, the second device having a thickness difference from the first device.

In some implementation schemes, a third wiring layer is provided on the second dielectric layer, and a fourth wiring layer is provided on the third dielectric layer, wherein the first wiring layer and the third wiring layer are conductively connected via the second conductive copper pillar layer and the heat dissipation copper block layer, the second wiring layer and the fourth wiring layer are conductively connected via the third conductive copper pillar layer, the terminal of the second device is conductively connected to the fourth wiring layer, and a back surface of the second device is connected to the third wiring layer.

In some implementation schemes, a first packaging layer is further provided on the upper surface of the first dielectric layer and in a gap between the first device and the first device cavity, and a second packaging layer is further provided on the upper surface of the second dielectric layer and in a gap between the second device and the second device cavity.

In some implementation schemes, the first dielectric layer, the second dielectric layer, and the third dielectric layer comprise an organic dielectric material, an inorganic dielectric material, or a combination thereof.

In some implementation schemes, the first dielectric layer, the second dielectric layer, and the third dielectric layer comprise polyimide, epoxy, bismaleimide triazine resin, ceramic packing, fiberglass, or a combination thereof.

In some implementation schemes, the first device and the second device respectively comprise a device having a double-side terminal so that the terminal of one side of the first device is in conductive connection with the second wiring layer, the terminal of the other side of the first device is in conductive connection with the heat dissipation copper block layer through the first wiring layer, the terminal of one side of the second device is in conductive connection with the fourth wiring layer, and the terminal of the other side of the second device is in conductive connection with the third wiring layer.

In some implementation schemes, the first device and the second device comprise a device having a single-side terminal respectively so that the terminal of the first device is in conductive connection with the second wiring layer, a back surface of the first device is connected to the heat dissipation copper block layer through the first wiring layer, the terminal of the second device is in conductive connection with the fourth wiring layer, and the back surface of the second device is connected to the third wiring layer.

Preferably, the first device and the second device comprise at least one device respectively.

In some implementation schemes, the first device and the second device comprise one or more of a chip, a capacitor, an inductor, and a resistor respectively.

In some implementation schemes, the first conductive copper pillar layer, the second conductive copper pillar layer, the third conductive copper pillar layer comprise at least one copper through-hole pillar respectively. Preferably, the first conductive copper pillar layer, the second conductive copper pillar layer, and the third conductive copper pillar layer comprise copper through-hole pillars of different dimensions respectively.

The second aspect of the invention provides a manufacturing method for a multi-device graded embedding package substrate, comprising steps of:
  (a) presetting an organic matrix substrate, wherein the organic matrix substrate comprises a first conductive copper pillar layer and a first loop-back strip-shaped copper pillar layer penetrating through the organic matrix substrate, the first loop-back strip-shaped copper pillar layer comprising at least one loop-back strip-shaped copper pillar;
  (b) etching one loop-back strip-shaped copper pillar in the first loop-back strip-shaped copper pillar layer and removing dielectric material from it to form a first device cavity to prepare a first dielectric layer;
  (c) attaching the first device on the bottom of the first device cavity, and forming a first packaging layer on an upper surface of the first dielectric layer and in a gap between the first device and the first device cavity;
  (d) forming a first wiring layer on the first packaging layer and forming a second wiring layer on the first dielectric layer so that the first wiring layer and the second wiring layer are conductively connected through the first conductive copper pillar layer, wherein a terminal of the first device is conductively connected to the second wiring layer, and a back surface of the first device is connected to the first wiring layer;
  (e) forming a second conductive copper pillar layer, a heat dissipation copper block layer, and a second loop-back strip-shaped copper pillar layer on the first wiring layer, and forming a third conductive copper pillar layer and a third loop-back strip-shaped copper pillar layer on the second wiring layer so that the first device and the heat dissipation copper block layer are connected via the first wiring layer, and the second loop-back strip-shaped copper pillar layer and the third loop-back strip-shaped copper pillar layer respectively longitudinally coincide with the first loop-back strip-shaped copper pillar layer;
  (f) laminating a dielectric material above and below the first dielectric layer, thinning the dielectric material, exposing ends of the second conductive copper pillar layer, the heat dissipation copper block layer, and the second loop-back strip-shaped copper pillar layer to form a second dielectric layer, and exposing ends of the third conductive copper pillar layer and the third loop-back strip-shaped copper pillar layer to form a third dielectric layer;
  (g) simultaneously etching the loop-back strip-shaped copper pillars of the first loop-back strip-shaped copper pillar layer, the second loop-back strip-shaped copper pillar layer, and the third loop-back strip-shaped copper pillar layer longitudinally at the same position, and removing the dielectric material therein to form a second device cavity;
  (h) attaching a second device on the bottom of the second device cavity, and forming a second packaging layer on the upper surface of the second dielectric layer and in the gap between the second device and the second device cavity;
  and (i) forming a third wiring layer on the second packaging layer, and a fourth wiring layer on the third dielectric layer so that the first wiring layer and the third wiring layer are conductively connected via the second conductive copper pillar layer and the heat dissipation copper block layer, the second wiring layer and the fourth wiring layer are conductively connected via the third conductive copper pillar layer, the terminal of the second device is conductively connected to the fourth wiring layer, and the back surface of the second device is conductively connected the third wiring layer.

In some implementation schemes, an end of the first conductive copper pillar layer and an end of the first loop-back strip-shaped copper pillar layer are respectively flush with or higher than the organic matrix substrate.

In some implementation schemes, step (c) comprises:
  (c1) providing a first adhesive layer on the bottom of the first dielectric layer;
  (c2) the first device into the first device cavity, wherein a terminal face of the first device is attached to the first adhesive layer;
  (c3) laminating a photosensitive packaging material on the upper surface of the first dielectric layer and in a gap between the first device and the first device cavity;
  (c4) exposing and developing the photosensitive packaging material to expose ends of the first conductive copper pillar layer and the first loop-back strip-shaped copper pillar layer and the back surface of the first device to form a first packaging layer;
  and (c5) removing the first adhesive layer.

In some implementation schemes, step (d) comprises:
(d1) forming a first metal seed layer on the first packaging layer and a second metal seed layer on the first dielectric layer;
(d2) applying a first photoresist layer on the first metal seed layer and a second photoresist layer on the second metal seed layer;
(d3) exposing and developing the first photoresist layer and the second photoresist layer to respectively form a first feature pattern and a second feature pattern;
(d4) electroplating in the first feature pattern to form a first wiring layer and electroplating in the second feature pattern to form a second wiring layer;
and (d5) removing the first photoresist layer and the second photoresist layer.

In some implementation schemes, step (e) comprises:
(e1) applying a third photoresist layer on the first wiring layer and applying a fourth photoresist layer on the second wiring layer;
(e2) exposing and developing the third photoresist layer and the fourth photoresist layer to respectively form a third feature pattern and a fourth feature pattern;
(e3) electroplating in the third feature pattern to form the second conductive copper pillar layer, the heat dissipation copper block layer, and the second loop-back strip-shaped copper pillar layer, and electroplating in the fourth feature pattern to form the third conductive copper pillar layer and the third loop-back strip-shaped copper pillar layer;
and (e4) removing the third photoresist layer and the fourth photoresist layer, and etching away the first metal seed layer and the second metal seed layer.

In some implementation schemes, step (f) comprises integrally thinning dielectric materials above and below the first dielectric layer respectively by means of plate grinding or plasma etching to expose ends of the second conductive copper pillar layer, the heat dissipation copper block layer, and the second loop-back strip-shaped copper pillar layer, and ends of the third conductive copper pillar layer and the third loop-back strip-shaped copper pillar layer.

In some implementation schemes, step (f) comprises locally thinning dielectric materials above and below the first dielectric layer respectively by means of laser or mechanical drilling to expose ends of the second conductive copper pillar layer, the heat dissipation copper block layer, and the second loop-back strip-shaped copper pillar layer, and ends of the third conductive copper pillar layer and the third loop-back strip-shaped copper pillar layer.

In some implementation schemes, step (f) comprises locally thinning dielectric materials above and below the first dielectric layer respectively by exposing and developing to expose ends of the second conductive copper pillar layer, the heat dissipation copper block layer, and the second loop-back strip-shaped copper pillar layer, and ends of the third conductive copper pillar layer and the third loop-back strip-shaped copper pillar layer.

In some implementation schemes, step (h) comprises:
(h1) providing a second adhesive layer at the bottom of the third dielectric layer;
(h2) placing the second device into the second device cavity, wherein the terminal face of the second device is attached to the second adhesive layer;
(h3) laminating a photosensitive packaging material on the upper surface of the second dielectric layer and in a gap between the second device and the second device cavity;
(h4) exposing and developing the photosensitive packaging material to expose ends of the second conductive copper pillar layer and the heat dissipation copper block layer and the back surface of the second device to form a second packaging layer;
and (h5) removing the second adhesive layer.

In some implementation schemes, step (i) comprises:
(i1) forming a third metal seed layer on the second packaging layer and a fourth metal seed layer on the third dielectric layer;
(i2) applying a fifth photoresist layer on the third metal seed layer and a sixth photoresist layer on the fourth metal seed layer;
(i3) exposing and developing the fifth photoresist layer and the sixth photoresist layer to respectively form a fifth feature pattern and a sixth feature pattern;
(i4) electroplating in the fifth feature pattern to form a third wiring layer and electroplating in the sixth feature pattern to form a fourth wiring layer;
and (i5) removing the fifth photoresist layer and the sixth photoresist layer, and etching away the third metal seed layer and the fourth metal seed layer.

In some implementation schemes, preparing the metal seed layer by electroless plating or sputtering is included. Preferably, the metal seed layer is prepared by means of sputtering.

Preferably, the metal seed layer comprises titanium, copper, a titanium-tungsten alloy, or a combination thereof.

BRIEF DESCRIPTION OF THE DRAWINGS

For a better understanding of the invention and to show the embodiment thereof, reference is now made, purely by way of example, to the accompanying drawings.

When referring to the accompanying drawings, it must be emphasized that the specific illustrations are exemplary and only for the purpose of demonstrative discussion of the preferred embodiments of the present invention, and are presented based on the provision that they are considered to be the most useful and understandable illustration of the description of the principles and concepts of the present invention. In this regard, no attempt is made to show structural details of the invention in more detail than is necessary for a fundamental understanding of the invention; the description with reference to the drawings will enable one skilled in the art to recognize how the several forms of the invention may be embodied in practice. In the drawings.

DETAILED DESCRIPTION

Figure 1:
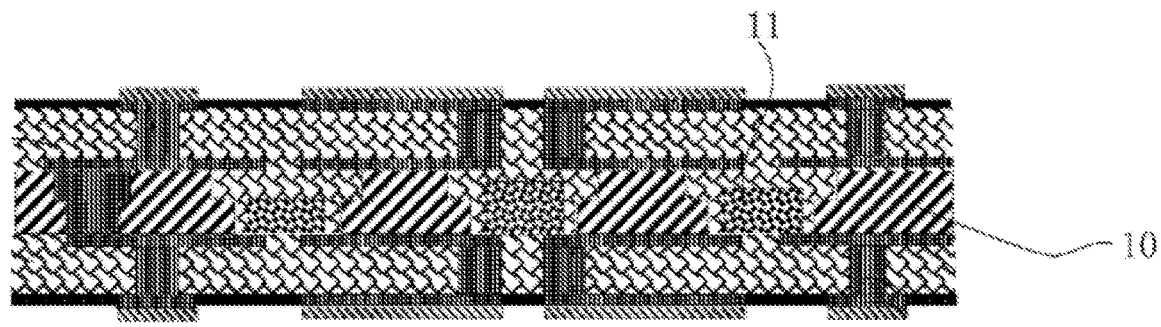
FIG. 1 is a schematic cross-sectional view of an integrated circuit packaging method and package structure according to the prior art.
Figure 2:
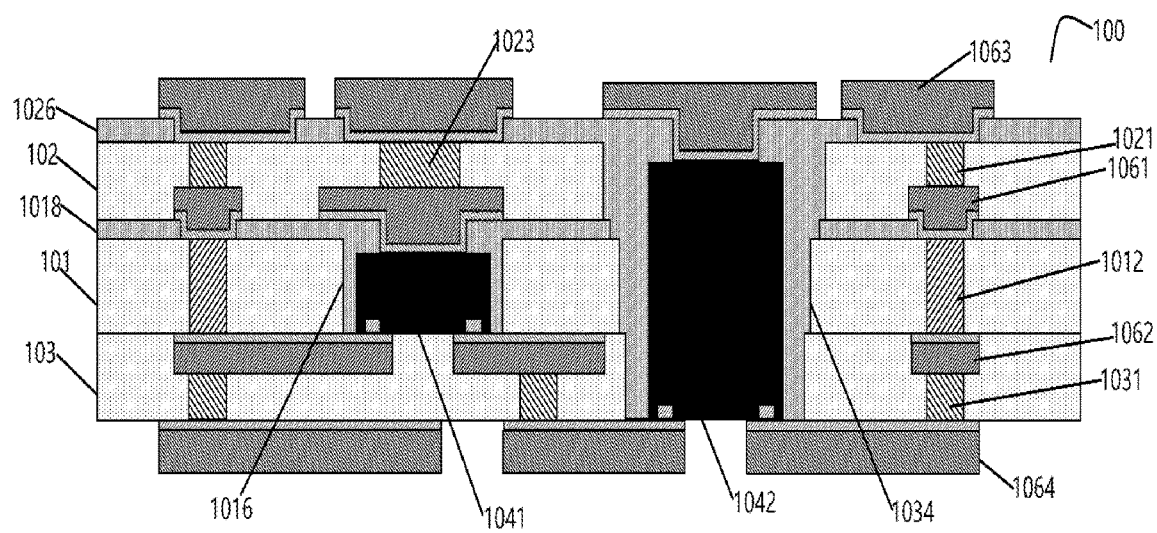
FIG. 2 is a schematic cross-sectional view of a multi-device graded embedding package substrate according to one implementation scheme of the present invention.

Referring to FIG. 2, a schematic cross-sectional view of an embedded package substrate 100 is shown. The package substrate 100 comprises a first dielectric layer 101, a second dielectric layer 102 above the first dielectric layer 101, and a third dielectric layer 103 below the first dielectric layer 101. The first dielectric layer 101, the second dielectric layer 102, and the third dielectric layer 103 may comprise the same material or different materials; and may comprise organic dielectric materials, inorganic dielectric materials, or combinations thereof, preferably, polyimides, epoxy resins, bismaleimide triazine resins (BT), ceramic packing, glass fibers or a combination thereof. Dividing according to functional requirements, the dielectric material may be selected from photosensitive materials and non-photosensitive materials.

The first dielectric layer 101 comprises a first conductive copper pillar layer 1012 which penetrates through the first dielectric layer 101 in a height direction and a first device cavity 1016; the second dielectric layer 102 comprises a first wiring layer 1061 located in the lower surface of the second dielectric layer 102, a second conductive copper pillar layer 1021 and a heat dissipation copper block layer 1023 being provided on the first wiring layer 1061; the third dielectric layer 103 comprises a second wiring layer 1062 located in the upper surface of the third dielectric layer 103, a third conductive copper pillar layer 1031 is provided on the second wiring layer 1062, and the first wiring layer 1061 and the second wiring layer 1062 are conductively connected via the first conductive copper pillar layer 1012. Generally, the first conductive copper pillar layer 1012, the second conductive copper pillar layer 1021, and the third conductive copper pillar layer 1031 may respectively be provided with multiple copper through-hole pillars as transfer IO channels, and the cross-sectional dimensions may be the same or different.

A first device 1041 is attached to the bottom of the first device cavity 1016, a terminal of the first device 1041 is conductively connected to the second wiring layer 1062, and the back surface of the first device 1041 is connected to the heat dissipation copper block layer 1023 via the first wiring layer 1061. A second device cavity 1034 penetrating through the first dielectric layer 101, the second dielectric layer 102, and the third dielectric layer 103 is further included. A second device 1042 is attached at the bottom of the second device cavity 1034, and the second device 1042 differs from the first device 1041 in thickness difference. By respectively embedding the first device 1041 and the second device 1042 with different thicknesses in different dielectric layers, embedding and packaging of multiple components and parts with a large difference in thickness is achieved. Therefore, a double-side fan-out of each component and part is facilitated.

A third wiring layer 1063 is provided on the second dielectric layer 102, and a fourth wiring layer 1064 is provided on the third dielectric layer 103; the first wiring layer and the third wiring layer are conductively connected through the second conductive copper pillar layer 1021 and the heat dissipation copper block layer 1023; the second wiring layer 1062 and the fourth wiring layer 1064 are conductively connected through the third conductive copper pillar layer 1031; the terminal of the second device 1042 is conductively connected with the fourth wiring layer 1064; the back surface of the second device 1042 is connected to the third wiring layer 1063. The double-side fan-out of the second device 1042 is achieved.

Typically, the first device 1041 and the second device 1042 respectively comprise at least one device; the first device 1041 and the second device 1042 may each be a bare chip, such as a driver chip of an integrated circuit (IC driver), a FET, etc., or a passive device, such as a capacitor, a resistor, or an inductor, etc., or a single package after preliminary packaging, such as a BGA/LGA, etc., or a combination of multiple the devices. The first device 1041 and the second device 1042 may respectively be a device having a single-side terminal or a device having a double-side terminal for double-side conduction. In the present implementation scheme, only the first device 1041 and the second device 1042 are taken as examples to be respectively illustrated as devices having a single-side terminal. The terminal of the first device 1041 is conductively connected to the second wiring layer 1062, the back surface of the first device 1041 is connected to the heat dissipation copper block layer 1023 via the first wiring layer 1061, the terminal of the second device 1042 is conductively connected to the fourth wiring layer 1064, and the back surface of the second device 1042 is connected to the third wiring layer 1063. If the first device 1041 and the second device 1042 are respectively devices having double-side terminals, the terminal on one side of the first device 1041 is in conductive connection with the second wiring layer 1062, the terminal on the other side of the first device 1041 is in conductive connection with the heat dissipation copper block layer 1023 via the first wiring layer 1061, the terminal on one side of the second device 1042 is in conductive connection with the fourth wiring layer 1064, and the terminal on the other side of the second device 1042 is in conductive connection with the third wiring layer 1063.

A first packaging layer 1018 is also provided on the upper surface of the first dielectric layer 101 and in a gap between the first device 1041 and the first device cavity 1016 to facilitate packaging and fixing the first device 1041. A second packaging layer 1026 is further provided on the upper surface of the second dielectric layer 102 and in the gap between the second device 1042 and the second device cavity 1034 so as to facilitate packaging and fixing the second device 1042.

Figure 3A:
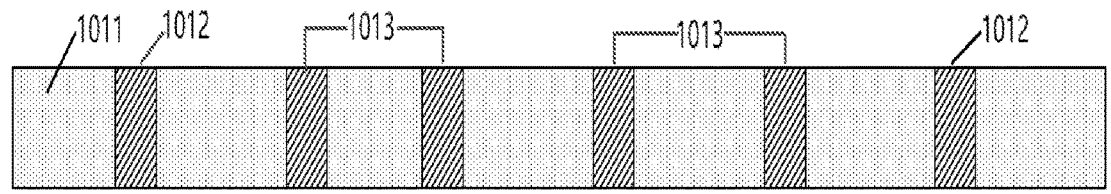
FIGS. 3A-3O show schematic cross-sectional views of intermediate structures of various steps of a manufacturing method for a multi-device graded embedding package substrate according to one implementation scheme of the present invention.
Figure 3B:
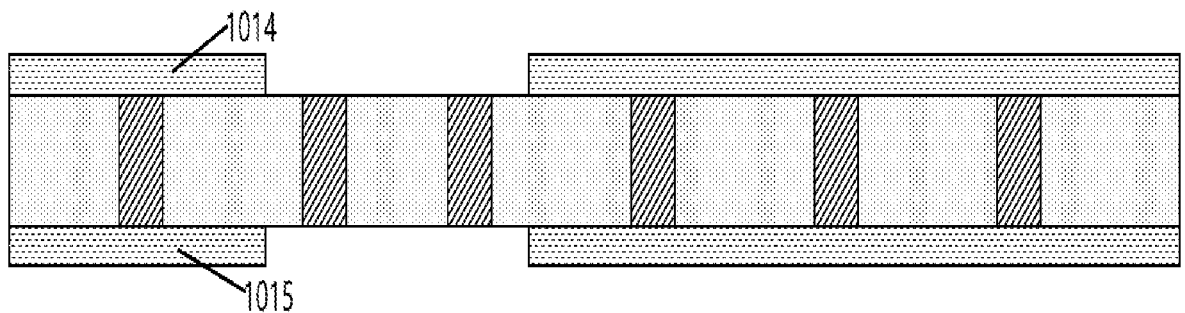
Figure 3C:
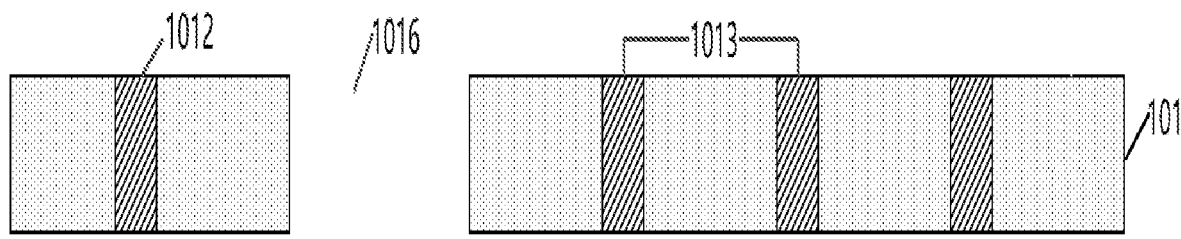
Figure 3D:
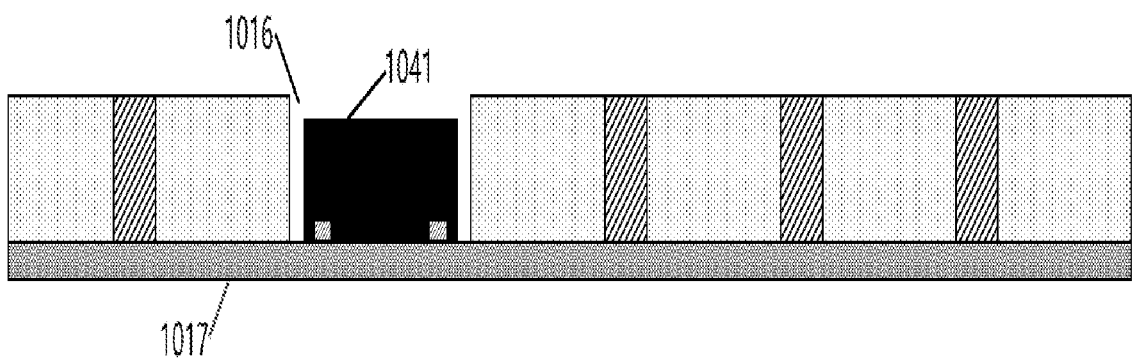
Figure 3E:
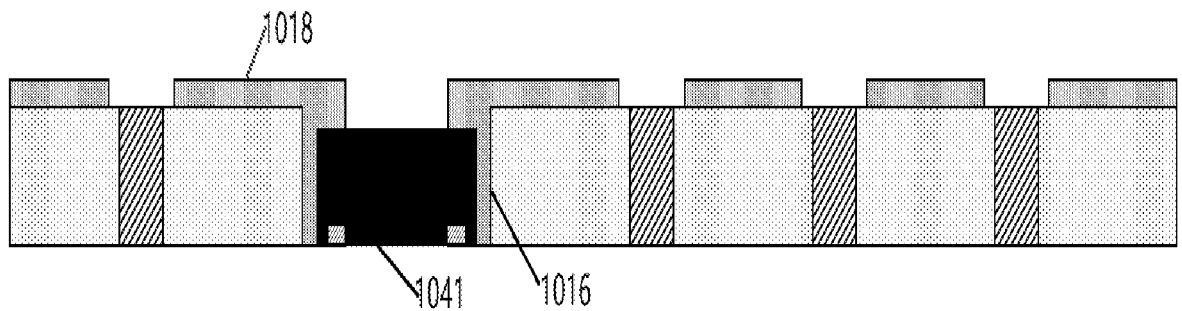
Figure 3F:
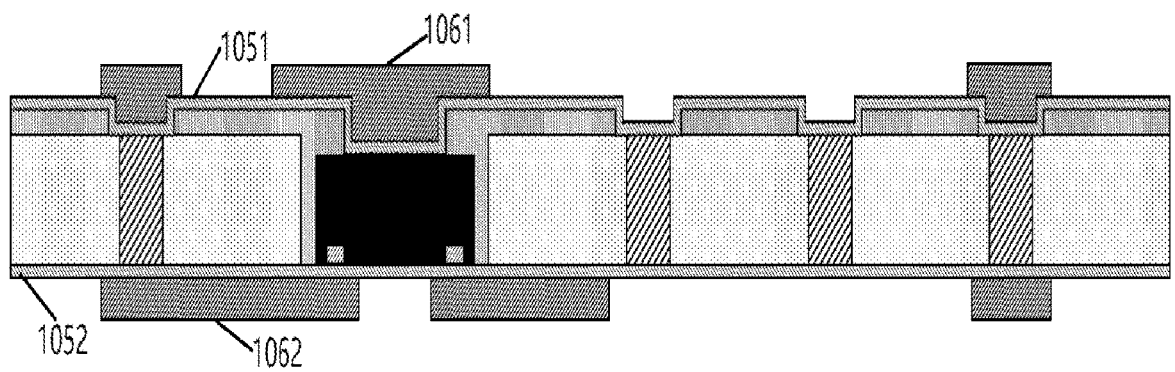
Figure 3G:
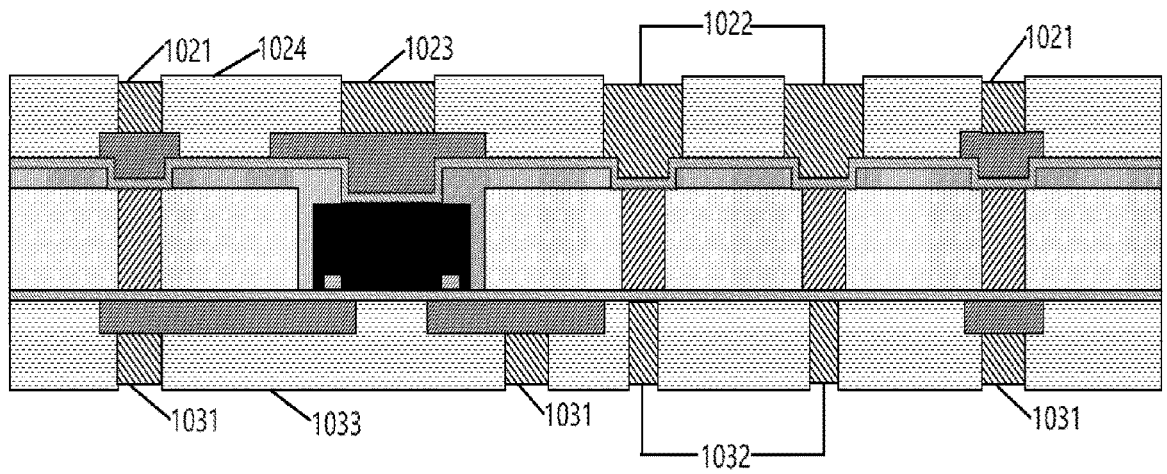
Figure 3H:
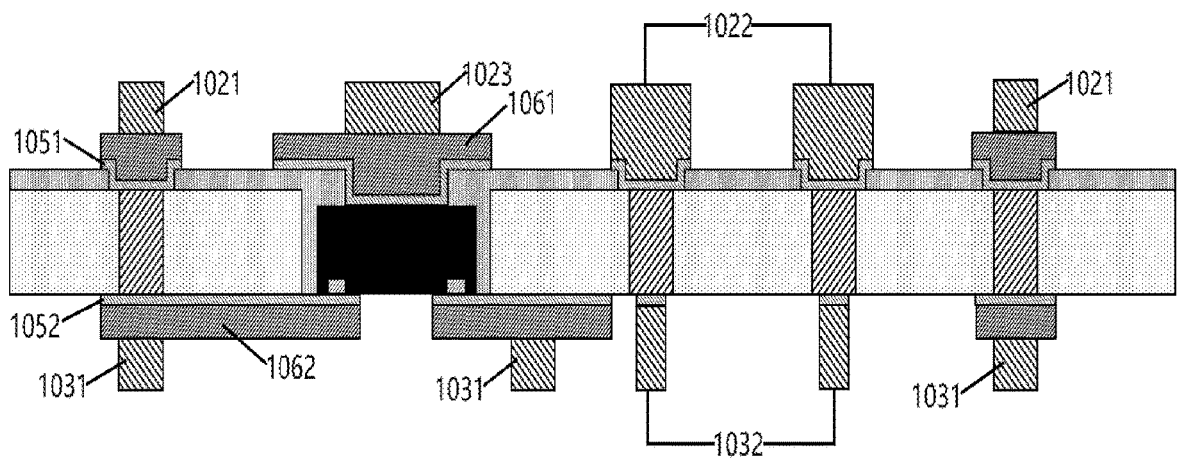
Figure 3I:
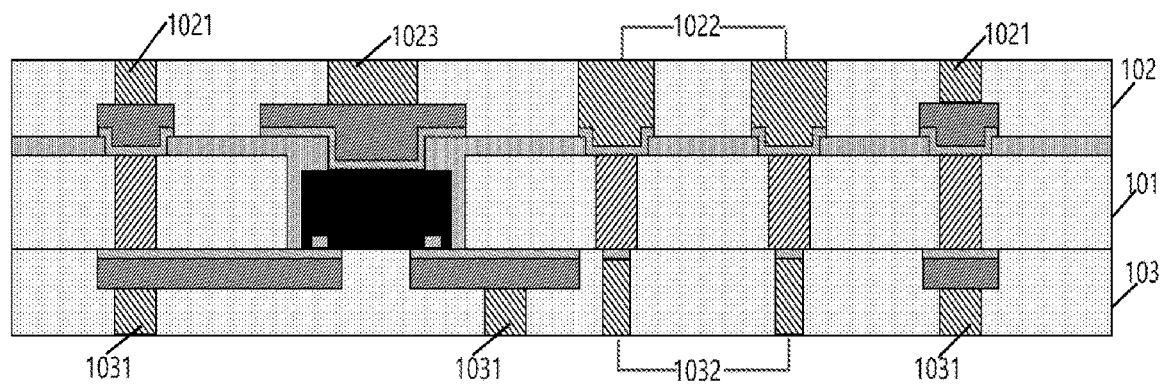
Figure 3J:
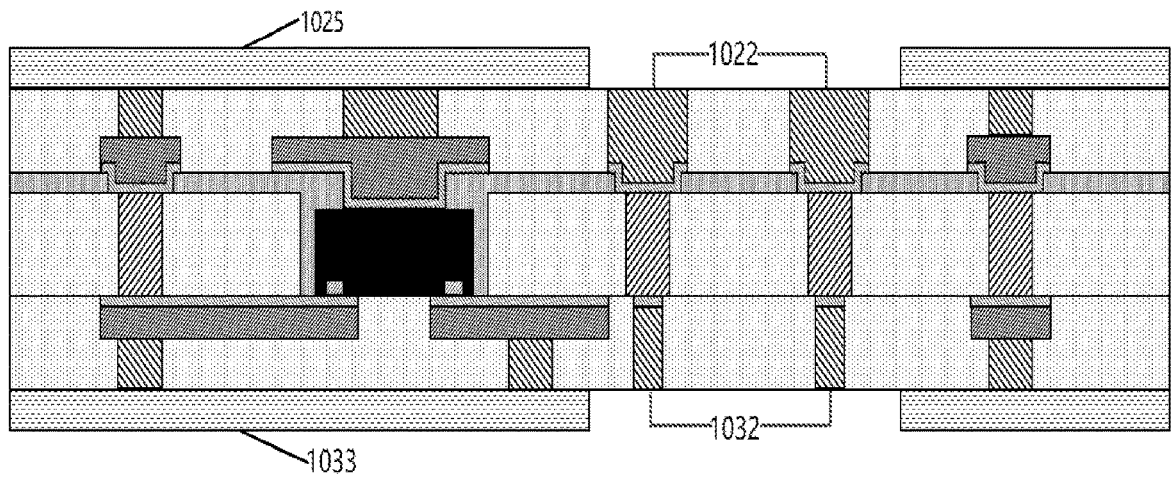
Figure 3K:
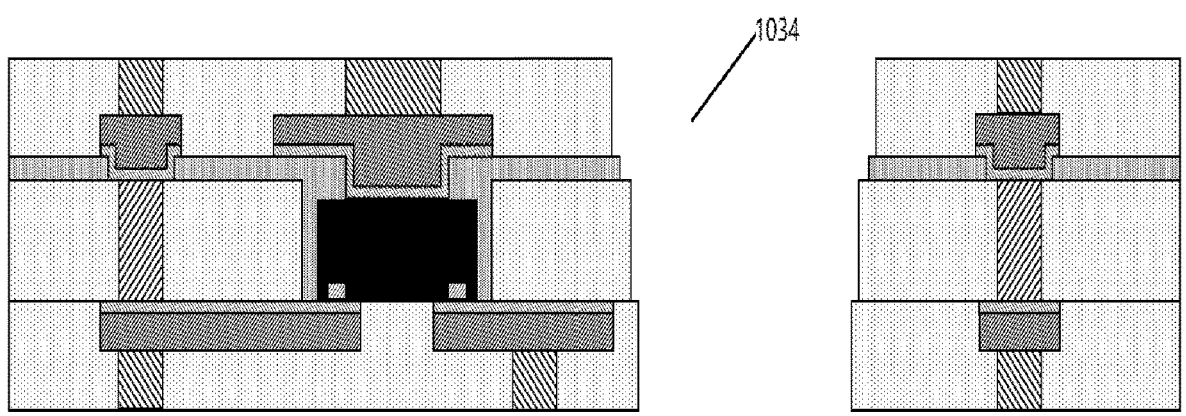
Figure 3L:
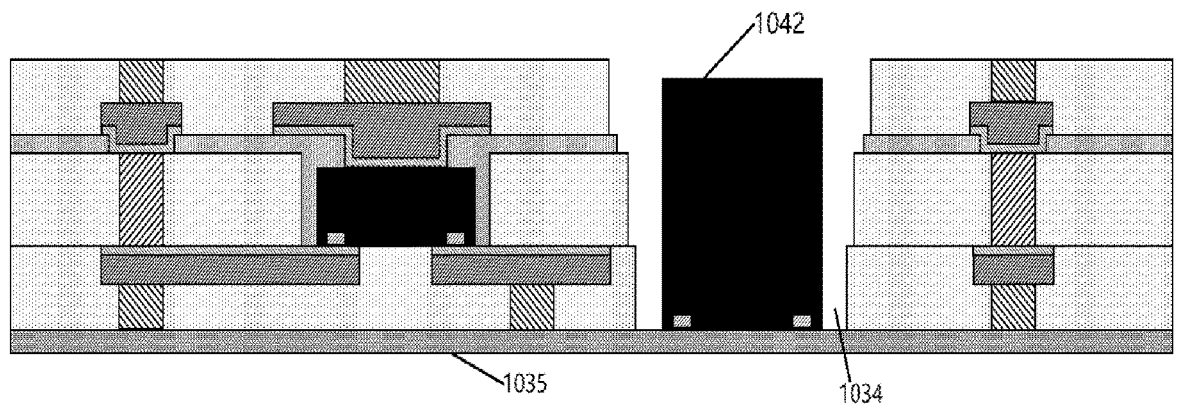
Figure 3M:
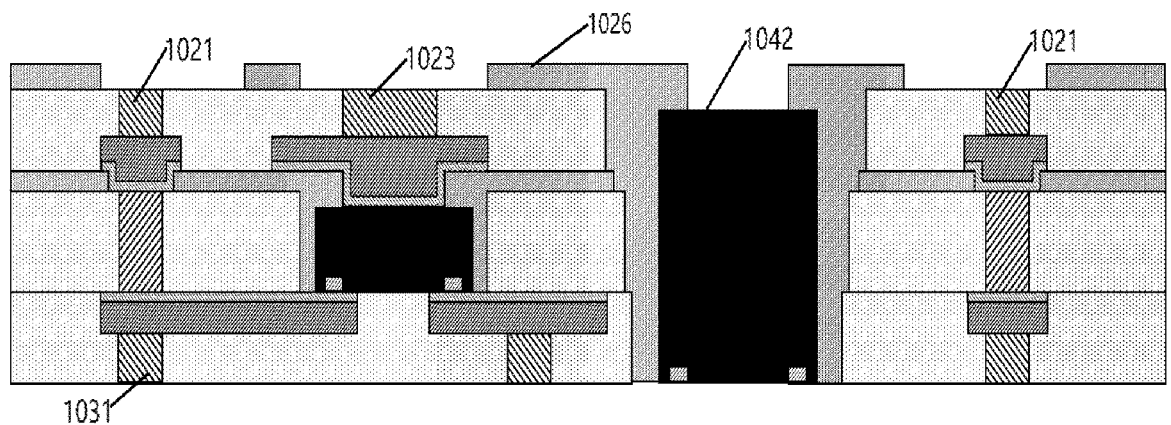
Figure 3N:
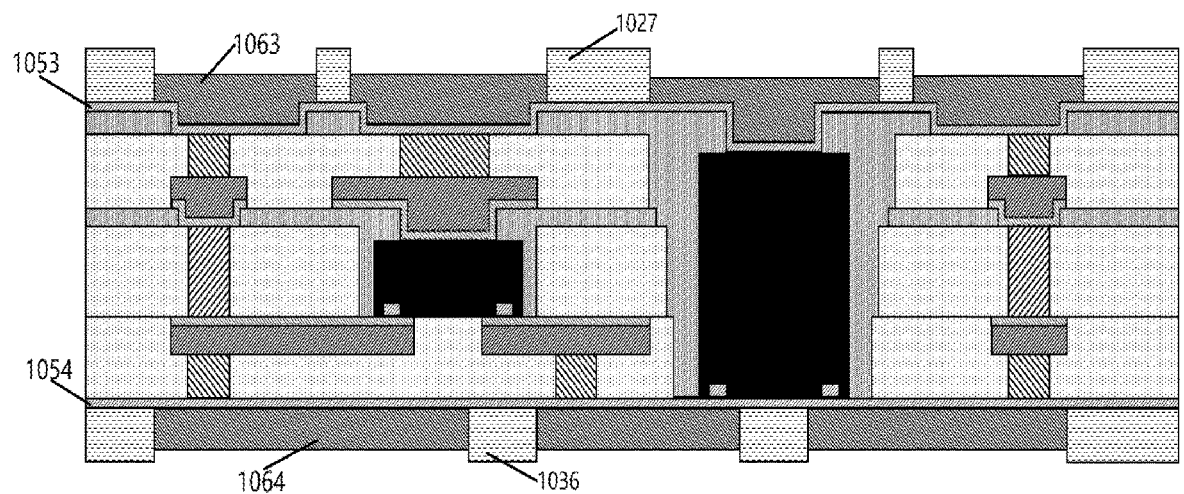
Figure 3O:
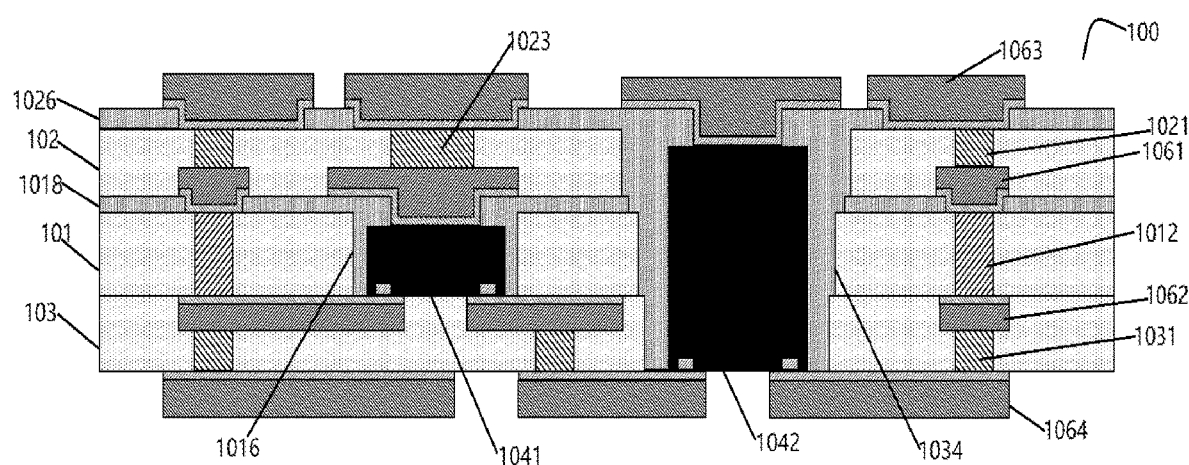

Referring to FIGS. 3A-3O, there are shown schematic cross-sectional views of intermediate structures of various steps of a manufacturing method for a multi-device graded embedding package substrate according to one implementation scheme of the present invention.

The manufacturing method comprises the following steps: preparing an organic matrix substrate 1011—step (a), as shown in FIG. 3A. The organic matrix substrate 1011 comprises a first loop-back strip-shaped copper pillar layer 1013 and a first conductive copper pillar layer 1012 penetrating through the organic matrix substrate 1011. The first loop-back strip-shaped copper pillar layer 1013 comprises at least one loop-back strip-shaped copper pillar. Generally, the end of the first conductive copper pillar layer 1012 may be flush with the organic matrix substrate 1011 or may be higher than the organic matrix substrate 1011; the first conductive copper pillar layer 1012 may be provided with multiple copper through-hole posts as transfer IO channels, which may be of the same size or different sizes. The end of the first loop-back strip-shaped copper pillar layer 1013 may be flush with the organic matrix substrate 1011, or may be higher than the organic matrix substrate 1011; the first loop-back strip-shaped copper pillar layer 1013 may be provided with multiple loop-back strip-shaped copper pillars for subsequently manufacturing a device cavity, and the number is determined according to the number of components and parts required to be embedded, and the dimensions of the loop-back strip-shaped copper pillars may be the same or different; in the present implementation scheme, only situations including two loop-back strip-shaped copper pillars are demonstrated subsequently, but the present implementation scheme is not limited to perform subsequent operations only when two loop-back strip-shaped copper pillars are included in the loop-back strip-shaped copper pillar layer.

Generally, the manufacturing method for the organic matrix substrate 1011 comprises the following sub-steps:
- obtaining a sacrificial carrier;
- applying a copper seed layer on the sacrificial carrier;
- applying a resist layer on the sacrificial carrier;
- applying another copper seed layer;
- applying a photoresist layer;
- patterning the photoresist to a pattern having a copper through-hole and a loop-back strip-shaped through-hole;
- electroplating copper in the pattern to form a first conductive copper pillar layer 1012 and a first loop-back strip-shaped copper pillar layer 1013;
- stripping the photoresist layer;
- using a dielectric material to laminate the first conductive copper pillar layer 1012 and the first loop-back strip-shaped copper pillar layer 1013;
- thinning and planarizing the dielectric material to expose the ends of the first conductive copper pillar layer 1012 and the first loop-back strip-shaped copper pillar layer 1013;
- removing the sacrificial carrier;
- and etching the resist layer to form an organic matrix substrate 1011.

Next, a seventh photoresist layer 1014 and an eighth photoresist layer 1015 are respectively applied on the upper surface and lower surface of the organic matrix substrate 1011, the seventh photoresist layer 1014 and the eighth photoresist layer 1015 are exposed and developed, and one loop-back strip-shaped copper pillar in the first loop-back strip-shaped copper pillar layer 1013 is exposed—step (b), as shown in FIG. 3B.

Then, the loop-back strip-shaped copper pillar is etched and the dielectric material therein is removed to form a first device cavity 1016, and the seventh photoresist layer 1014 and the eighth photoresist layer 1015 are removed to prepare a first dielectric layer 101—step (c), as shown in FIG. 3C.

Next, a first adhesive layer 1017 is provided on the bottom of the first dielectric layer 101, and the first device 1041 is placed into the first device cavity 1016. The terminal face of the first device 1041 is attached to the first adhesive layer 1017—step (d), as shown in FIG. 3D. The first adhesive layer 1017 may be a tape. Typically, tape is a commercially available transparent film that is thermally decomposable or decomposable under ultraviolet radiation. The first device 1041 is placed into the first device cavity 1016 and the terminal face of the first device 1041 is attached to the exposed first adhesive layer 1017 to support the first device 1041 for temporary fixation.

The first device 1041 may be a bare chip, such as a driver chip of an integrated circuit (IC driver), a FET, etc., or a passive device, such as a capacitor, a resistor, or an inductor, etc., or a single package after preliminary packaging, such as a BGA/LGA, etc., or a combination of multiple the devices. The first device 1041 may be a device having a single-side terminal or a device having a double-side terminal for double-side conduction. In the present implementation scheme, only a device including a single-side terminal is demonstrated subsequently, but the present implementation scheme is not limited to performing subsequent operations only on a device including a single-side terminal.

Then, a photosensitive packaging material is laminated on the upper surface of the first dielectric layer 101 and the gap between the first device 1041 and the first device cavity 1016; the photosensitive packaging material is exposed and developed; the ends of the first conductive copper pillar layer 1012 and the first loop-back strip-shaped copper pillar layer 1013 and the back surface of the first device 1041 are exposed; the first adhesive layer 1017 is removed to form a first packaging layer 1018—step (e), as shown in FIG. 3E. Generally, the first adhesive layer 1017 may be removed by ultraviolet light irradiation or thermal decomposition.

Next, a first wiring layer 1061 is formed on the first packaging layer 1018, and a second wiring layer 1062 is formed on the first dielectric layer 101—step (f), as shown in FIG. 3F. Generally, the following steps are included:
- forming a first metal seed layer 1051 on the first packaging layer 1018, and forming a second metal seed layer 1052 on the first dielectric layer 101;
- applying a first photoresist layer on the first metal seed layer 1051, and applying a second photoresist layer on the second metal seed layer 1052;
- exposing and developing the first photoresist layer and the second photoresist layer to respectively form a first feature pattern and a second feature pattern;
- electroplating in the first feature pattern to form a first wiring layer 1061, and electroplating in the second feature pattern to form a second wiring layer 1062;
- and removing the first photoresist layer and the second photoresist layer.

Generally, a first metal seed layer 1051 and a second metal seed layer 1052 can be respectively formed on the first packaging layer 1018 and the first dielectric layer 101 by means of electroless plating or sputtering. The first metal seed layer 1051 and the second metal seed layer 1052 can respectively comprise titanium, copper, a titanium-tungsten alloy, or a combination thereof; preferably, the first metal seed layer 1051 and the second metal seed layer 1052 are manufactured by sputtering titanium and copper. The first wiring layer 1061 and the second wiring layer 1062 are formed by electroplating copper in the first feature pattern and the second feature pattern, respectively. The thickness of the first wiring layer 1061 and the second wiring layer 1062 can be determined according to practical requirements.

By exposing and developing the first photoresist layer and the second photoresist layer, a route pattern on the first packaging layer 1018 and the first dielectric layer 101 and an area where a heat dissipation copper block needs to be provided on the back surface of the first device 1041 are exposed. At the same time, by shielding the first loop-back strip-shaped copper pillar layer 1013, the requirement for an alignment ring width at one exposure can be reduced, and the space utilization rate can be improved to a certain extent, which is beneficial to high-density integration.

Then, a second conductive copper pillar layer 1021, a heat dissipation copper block layer 1023, and a second loop-back strip-shaped copper pillar layer 1022 are formed on the first wiring layer 1061, and a third conductive copper pillar layer 1031 and a third loop-back strip-shaped copper pillar layer 1032 are formed on the second wiring layer 1062—step (g), as shown in FIG. 3G. Generally, the following steps are included:
- applying a third photoresist layer 1024 on the first wiring layer 1061, and applying a fourth photoresist layer 1033 on the second wiring layer 1062;
- exposing and developing the third photoresist layer 1024 and the fourth photoresist layer 1033 to respectively form a third feature pattern and a fourth feature pattern;
- electroplating in the third feature pattern to form the second conductive copper pillar layer 1021, the heat dissipation copper block layer 1023, and the second loop-back strip-shaped copper pillar layer 1022, and electroplating in the fourth feature pattern to form the third conductive copper pillar layer 1031 and the third loop-back strip-shaped copper pillar layer 1032.

Generally, the second conductive copper pillar layer 1021 can be provided with multiple copper through-hole posts as transfer TO channels, and the dimensions thereof may be the same or different; the second loop-back strip-shaped copper pillar layer 1022 may be provided with multiple loop-back strip-shaped copper pillars for subsequently manufacturing a device cavity, and the number is determined according to the number of components and parts required to be embedded, and the dimensions of the loop-back strip-shaped copper pillars may be the same or different. The third conductive copper pillar layer 1031 can be provided with multiple copper through-hole posts as transfer TO channels, and the dimensions can be the same or different; the third loop-back strip-shaped copper pillar layer 1032 may be provided with multiple loop-back strip-shaped copper pillars for subsequently manufacturing a device cavity, and the number is determined according to the number of components and parts required to be embedded, and the dimensions of the loop-back strip-shaped copper pillars may be the same or different. The second loop-back strip-shaped copper pillar layer 1022 and the third loop-back strip-shaped copper pillar layer 1032 respectively longitudinally coincide with the first loop-back strip-shaped copper pillar layer 1013, facilitating the formation of a device cavity penetrating through multiple dielectric layers in a subsequent process.

Next, the third photoresist layer 1024 and the fourth photoresist layer 1033 are removed, and the first metal seed layer 1051 and the second metal seed layer 1052 are etched—step (h), as shown in FIG. 3H.

Then, dielectric materials are respectively laminated above and below the first dielectric layer 101, and the dielectric material is thinned to expose the ends of the second conductive copper pillar layer 1021, the heat dissipation copper pillar layer 1023, and the second loop-back strip-shaped copper pillar layer 1022 to form the second dielectric layer 102, and to expose the ends of the third conductive copper pillar layer 1031 and the third loop-back strip-shaped copper pillar layer 1032 to form the third dielectric layer 103—step (i), as shown in FIG. 3I. Generally, the dielectric material can be integrally thinned, for example, by plate grinding or plasma etching. The dielectric material can also be locally thinned. For example, the dielectric material on the second conductive copper pillar layer 1021, the heat dissipation copper pillar layer 1023, the second loop-back strip-shaped copper pillar layer 1022, the third conductive copper pillar layer 1031, and the third loop-back strip-shaped copper pillar layer 1032 can be locally thinned by means of laser or mechanical drilling to expose the ends of the second conductive copper pillar layer 1021, the heat dissipation copper pillar layer 1023, the second loop-back strip-shaped copper pillar layer 1022, the third conductive copper pillar layer 1031, and the third loop-back strip-shaped copper pillar layer 1032. Or when the dielectric material is a photosensitive dielectric material, the ends of the second conductive copper pillar layer 1021, the heat dissipation copper pillar layer 1023, the second loop-back strip-shaped copper pillar layer 1022, the third conductive copper pillar layer 1031, and the third loop-back strip-shaped copper pillar layer 1032 can be exposed by locally thinning the dielectric material by means of exposure and development. Preferably, the ends of the second conductive copper pillar layer 1021, the heat dissipation copper pillar layer 1023, the second loop-back strip-shaped copper pillar layer 1022, the third conductive copper pillar layer 1031, and the third loop-back strip-shaped copper pillar layer 1032 are exposed by integrally thinning the dielectric material with plate grinding.

Next, a ninth photoresist layer 1025 and a tenth photoresist layer 1033 are respectively applied on the second dielectric layer 102 and the third dielectric layer 103. The ninth photoresist layer 1025 and the tenth photoresist layer 1033 are exposed and developed to expose loop-back strip-shaped copper pillars of the first loop-back strip-shaped copper pillar layer 1013, the second loop-back strip-shaped copper pillar layer 1022, and the third loop-back strip-shaped copper pillar layer 1032 longitudinally at the same position—step (j), as shown in FIG. 3J.

Then, the loop-back strip-shaped copper pillars of the first loop-back strip-shaped copper pillar layer 1013, the second loop-back strip-shaped copper pillar layer 1022, and the third loop-back strip-shaped copper pillar layer 1032 longitudinally at the same position are etched at the same time, and the dielectric material therein is removed to form a second device cavity 1034, and the ninth photoresist layer 1025 and tenth photoresist layer 1033 are removed—step (k), as shown in FIG. 3K.

Next, a second adhesive layer 1035 is provided on the bottom of the third dielectric layer 103, and a second device 1042 is placed into the second device cavity 1034. The terminal face of the second device 1042 is attached to the second adhesive layer 1035—step (l), as shown in FIG. 3L. Generally, the second adhesive layer 1035 may be a tape. Typically, tape is a commercially available transparent film that is thermally decomposable or decomposable under ultraviolet radiation. The second device 1042 is placed into the second device cavity 1034 and the terminal face of the second device 1042 is attached to the exposed second adhesive layer 1035 to support the second device 1042 for temporary fixation.

The second device 1042 may be a bare chip, such as a driver chip of an integrated circuit (IC driver), a FET, etc., or a passive device, such as a capacitor, a resistor, or an inductor, etc., or a single package after preliminary packaging, such as a BGA/LGA, etc., or a combination of multiple the devices. The second device 1042 may be a device having a single-side terminal or a device having a double-side terminal for double-side conduction. In the present implementation scheme, only a device including a single-side terminal is demonstrated subsequently, but the present implementation scheme is not limited to performing subsequent operations only on a device including a single-side terminal.

Then, a photosensitive packaging material is laminated on the upper surface of the second dielectric layer 102 and the gap between the second device 1042 and the second device cavity 1034; exposing and developing the photosensitive packaging material and exposing the ends of the second conductive copper pillar layer 1021 and the heat dissipation copper block layer 1023 and the back surface of the second device 1042, and removing the second adhesive layer 1035 are performed to form a second packaging layer 1026—step (m), as shown in FIG. 3M. Generally, the second adhesive layer 1035 may be removed by ultraviolet light irradiation or thermal decomposition.

Next, a third wiring layer 1063 is formed on the second packaging layer 1026, and a fourth wiring layer 1064 is formed on the third dielectric layer 103—step (n), as shown in FIG. 3N. Generally, the step includes the following steps:

forming a third metal seed layer 1053 on the second packaging layer 1026, and forming a fourth metal seed layer 1054 on the third dielectric layer 103;

applying a fifth photoresist layer 1027 on the third metal seed layer 1053, and applying a sixth photoresist layer 1036 on the fourth metal seed layer 1054;

exposing and developing the fifth photoresist layer 1027 and the sixth photoresist layer 1036, respectively forming a fifth feature pattern and a sixth feature pattern;

and electroplating in the fifth feature pattern to form a third wiring layer 1063, and electroplating in the sixth feature pattern to form a fourth wiring layer 1064.

Generally, a third metal seed layer 1053 and a fourth metal seed layer 1054 can be respectively formed on the second packaging layer 1026 and the third dielectric layer 103 by means of electroless plating or sputtering, and the third metal seed layer 1053 and the fourth metal seed layer 1054 can respectively comprise titanium, copper, a titanium-tungsten alloy or a combination thereof; preferably, the third metal seed layer 1053 and the fourth metal seed layer 1054 are manufactured by sputtering titanium and copper. The third wiring layer 1063 and the fourth wiring layer 1064 are formed by electroplating copper in the fifth feature pattern and the sixth feature pattern, respectively. The thickness of the third wiring layer 1063 and the fourth wiring layer 1064 can be determined according to practical requirements.

Finally, the fifth photoresist layer 1027 and the sixth photoresist layer 1036 are removed, and the third metal seed layer 1053 and the fourth metal seed layer 1054 are etched—step (o), as shown in FIG. 3O.

Those skilled in the art will recognize that the invention is not limited to what has been particularly shown and described hereinabove and hereinafter. Furthermore, the scope of the invention is defined by the appended claims, including combinations and sub-combinations of the various technical features described hereinabove, as well as variations and modifications thereof, which would occur to persons skilled in the art upon reading the foregoing description.

In the claims, the term "comprising" and variations thereof such as "comprises", "comprise", and the like, mean that the recited assembly is included, but generally other assemblies are not excluded.

What is claimed is:

1. A method for manufacturing a multi-device graded embedding package substrate, the method comprising:
   (a) preparing an organic matrix substrate, wherein the organic matrix substrate comprises a first conductive copper pillar layer and a first loop-back strip-shaped copper pillar layer penetrating through the organic matrix substrate, the first loop-back strip-shaped copper pillar layer comprising at least one loop-back strip-shaped copper pillar;
   (b) etching one loop-back strip-shaped copper pillar in the first loop-back strip-shaped copper pillar layer and removing dielectric material from it to form a first device cavity to prepare a first dielectric layer;
   (c) attaching the first device on a bottom of the first device cavity, and forming a first packaging layer on an upper surface of the first dielectric layer and in a gap between the first device and the first device cavity;
   (d) forming a first wiring layer on the first packaging layer and forming a second wiring layer on the first dielectric layer so that the first wiring layer and the second wiring layer are conductively connected through the first conductive copper pillar layer, wherein a terminal of the first device is conductively connected to the second wiring layer, and a back surface of the first device is connected to the first wiring layer;
   (e) forming a second conductive copper pillar layer, a heat dissipation copper block layer, and a second loop-back strip-shaped copper pillar layer on the first wiring layer, and forming a third conductive copper pillar layer and a third loop-back strip-shaped copper pillar layer on the second wiring layer so that the first device and the heat dissipation copper block layer are connected via the first wiring layer, and the second loop-back strip-shaped copper pillar layer and the third loop-back strip-shaped copper pillar layer respectively longitudinally coincide with the first loop-back strip-shaped copper pillar layer;
   (f) laminating a dielectric material above and below the first dielectric layer, thinning the dielectric material, exposing ends of the second conductive copper pillar layer, the heat dissipation copper pillar layer, and the second loop-back strip-shaped copper pillar layer to form a second dielectric layer, and exposing ends of the third conductive copper pillar layer and the third loop-back strip-shaped copper pillar layer to form a third dielectric layer;
   (g) simultaneously etching the loop-back strip-shaped copper pillars of the first loop-back strip-shaped copper pillar layer, the second loop-back strip-shaped copper pillar layer, and the third loop-back strip-shaped copper pillar layer longitudinally at the same position, and removing the dielectric material in the loop-back strip-shaped copper pillar to form a second device cavity;
   (h) attaching a second device on the bottom of the second device cavity, and forming a second packaging layer on the upper surface of the second dielectric layer and in the gap between the second device and the second device cavity; and
   (i) forming a third wiring layer on the second packaging layer, and a fourth wiring layer on the third dielectric layer so that the first wiring layer and the third wiring layer are conductively connected via the second conductive copper pillar layer and the heat dissipation copper block layer, the second wiring layer and the fourth wiring layer are conductively connected via the third conductive copper pillar layer, the terminal of the second device is conductively connected to the fourth wiring layer, and the back surface of the second device is conductively connected the third wiring layer.

2. The method of claim 1, wherein an end of the first conductive copper pillar layer and an end of the first loop-back strip-shaped copper pillar layer are respectively flush with or higher than the organic matrix substrate.

3. The method of claim 1, wherein the step (c) comprises:
   (c1) providing a first adhesive layer on the bottom of the first dielectric layer;
   (c2) the first device into the first device cavity, wherein a terminal face of the first device is attached to the first adhesive layer;
   (c3) laminating a photosensitive packaging material on the upper surface of the first dielectric layer and in a gap between the first device and the first device cavity;
   (c4) exposing and developing the photosensitive packaging material to expose ends of the first conductive copper pillar layer and the first loop-back strip-shaped copper pillar layer and the back surface of the first device to form a first packaging layer; and
   (c5) removing the first adhesive layer.

4. The method of claim 1, wherein the step (d) comprises:
(d1) forming a first metal seed layer on the first packaging layer and a second metal seed layer on the first dielectric layer;
(d2) applying a first photoresist layer on the first metal seed layer and a second photoresist layer on the second metal seed layer;
(d3) exposing and developing the first photoresist layer and the second photoresist layer to respectively form a first feature pattern and a second feature pattern;
(d4) electroplating in the first feature pattern to form a first wiring layer and electroplating in the second feature pattern to form a second wiring layer; and
(d5) removing the first photoresist layer and the second photoresist layer.

5. The method of claim 4, wherein the step (e) comprises:
(e1) applying a third photoresist layer on the first wiring layer and applying a fourth photoresist layer on the second wiring layer;
(e2) exposing and developing the third photoresist layer and the fourth photoresist layer to respectively form a third feature pattern and a fourth feature pattern;
(e3) electroplating in the third feature pattern to form the second conductive copper pillar layer, the heat dissipation copper block layer, and the second loop-back strip-shaped copper pillar layer, and electroplating in the fourth feature pattern to form the third conductive copper pillar layer and the third loop-back strip-shaped copper pillar layer; and
(e4) removing the third photoresist layer and the fourth photoresist layer, and etching away the first metal seed layer and the second metal seed layer.

6. The method of claim 1, wherein the step (f) comprises integrally thinning dielectric materials above and below the first dielectric layer respectively by means of plate grinding or plasma etching to expose ends of the second conductive copper pillar layer, the heat dissipation copper pillar layer, and the second loop-back strip-shaped copper pillar layer, and ends of the third conductive copper pillar layer and the third loop-back strip-shaped copper pillar layer.

7. The method of claim 1, wherein the step (f) comprises locally thinning dielectric materials above and below the first dielectric layer respectively by means of laser or mechanical drilling to expose ends of the second conductive copper pillar layer, the heat dissipation copper pillar layer, and the second loop-back strip-shaped copper pillar layer, and ends of the third conductive copper pillar layer and the third loop-back strip-shaped copper pillar layer.

8. The method of claim 1, wherein the step (f) comprises locally thinning dielectric materials above and below the first dielectric layer respectively by exposing and developing to expose ends of the second conductive copper pillar layer, the heat dissipation copper pillar layer, and the second loop-back strip-shaped copper pillar layer, and ends of the third conductive copper pillar layer and the third loop-back strip-shaped copper pillar layer.

9. The method of claim 1, wherein the step (h) comprises:
(h1) providing a second adhesive layer at the bottom of the third dielectric layer;
(h2) placing the second device into the second device cavity, wherein the terminal face of the second device is attached to the second adhesive layer;
(h3) laminating a photosensitive packaging material on the upper surface of the second dielectric layer and in a gap between the second device and the second device cavity;
(h4) exposing and developing the photosensitive packaging material to expose ends of the second conductive copper pillar layer and the heat dissipation copper block layer and the back surface of the second device to form a second packaging layer; and
(h5) removing the second adhesive layer.

10. The method of claim 1, wherein the step (i) comprises:
(i1) forming a third metal seed layer on the second packaging layer and a fourth metal seed layer on the third dielectric layer;
(i2) applying a fifth photoresist layer on the third metal seed layer and a sixth photoresist layer on the fourth metal seed layer;
(i3) exposing and developing the fifth photoresist layer and the sixth photoresist layer to respectively form a fifth feature pattern and a sixth feature pattern;
(i4) electroplating in the fifth feature pattern to form a third wiring layer and electroplating in the sixth feature pattern to form a fourth wiring layer; and
(i5) removing the fifth photoresist layer and the sixth photoresist layer, and etching away the third metal seed layer and the fourth metal seed layer.

11. The method of claim 1, further comprising preparing a metal seed layer by electroless plating or sputtering.

12. The method of claim 1, wherein the metal seed layer comprises titanium, copper, a titanium-tungsten alloy, or a combination thereof.

* * * * *